(12) United States Patent
Kamisuki et al.

(10) Patent No.: US 9,194,042 B2
(45) Date of Patent: Nov. 24, 2015

(54) JIG FOR SEMICONDUCTOR PRODUCTION AND METHOD FOR PRODUCING SAME

(75) Inventors: Yoichi Kamisuki, Tokyo (JP); Shinji Kondoh, Tokyo (JP); Yasuji Fukasawa, Tokyo (JP); Masanori Kawaguchi, Tokyo (JP); Atsuto Hashimoto, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/446,972

(22) Filed: Apr. 13, 2012

(65) Prior Publication Data

US 2012/0196038 A1   Aug. 2, 2012

Related U.S. Application Data

(63) Continuation of application No. PCT/JP2010/068095, filed on Oct. 14, 2010.

(30) Foreign Application Priority Data

Oct. 14, 2009   (JP) .................. 2009-237502

(51) Int. Cl.
*C23C 16/00* (2006.01)
*C23C 16/50* (2006.01)
*C23F 1/00* (2006.01)
(Continued)

(52) U.S. Cl.
CPC ........... *C23C 16/325* (2013.01); *C23C 16/4404* (2013.01); *C23C 16/4581* (2013.01); *C30B 25/02* (2013.01); *C30B 25/12* (2013.01); *C30B 29/36* (2013.01); *C30B 35/00* (2013.01); *H01L 21/67366* (2013.01)

(58) Field of Classification Search
CPC .................................................. H01L 21/67366
USPC ................. 118/728–733; 156/345.51–345.55
See application file for complete search history.

(56) References Cited

U.S. PATENT DOCUMENTS 7,250,114 B2   7/2007   Kiehlbauch et al.
2004/0089236 A1*   5/2004   Yokogawa et al. ........... 118/715
(Continued)

FOREIGN PATENT DOCUMENTS

JP   2000-327459   11/2000
JP   2002-097092   4/2002
(Continued)

OTHER PUBLICATIONS

English Machine Translation of JP 2006103981 A. Performed and printed on Aug. 7, 2013 from http://www4.ipdl.inpit.go.jp.*
(Continued)

*Primary Examiner* — Parviz Hassanzadeh
*Assistant Examiner* — Tiffany Nuckols
(74) *Attorney, Agent, or Firm* — Foley & Lardner LLP

(57) ABSTRACT

The present invention relates to: a jig for semiconductor production which is used for a CVD device in a semiconductor production process and contains a jig base and an SiC coating film formed on the jig base, in which the SiC coating film has a surface area ratio (surface area S2/surface area S1) between an apparent surface area S1 as calculated on the assumption that the surface is flat and free from unevenness and an actual surface area S2, of from 1.4 to 3.2; and a method for producing the jig for semiconductor production.

9 Claims, 4 Drawing Sheets

(51) Int. Cl.
*H01L 21/306* (2006.01)
*C23C 16/32* (2006.01)
*C23C 16/458* (2006.01)
*C23C 16/44* (2006.01)
*C30B 25/02* (2006.01)
*C30B 25/12* (2006.01)
*C30B 29/36* (2006.01)
*C30B 35/00* (2006.01)
*H01L 21/673* (2006.01)

(56) References Cited

U.S. PATENT DOCUMENTS

2005/0229857 A1* 10/2005 Beauchaine et al. .......... 118/728
2006/0011131 A1* 1/2006 Otsuki et al. .................... 117/98
2008/0110402 A1* 5/2008 Simpson ....................... 118/728

FOREIGN PATENT DOCUMENTS

| JP | 2004-111686 | | 4/2004 |
| JP | 2006103981 A | * | 4/2006 |
| JP | 2007-505509 | | 3/2007 |
| JP | 3956291 | | 5/2007 |

OTHER PUBLICATIONS

International Search Report in PCT/JP2010/068095 dated Jan. 18, 2011.

* cited by examiner

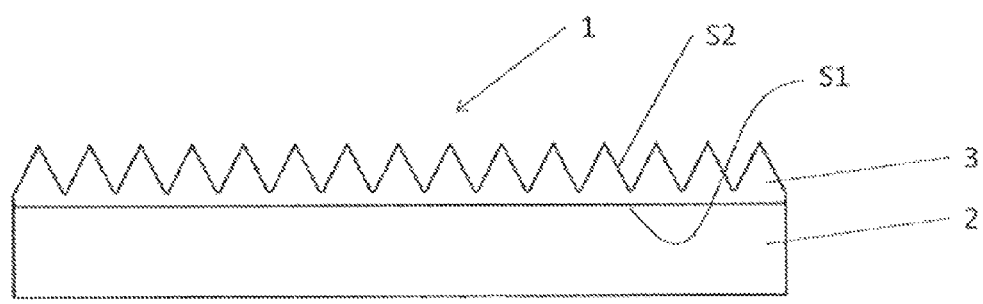

US 9,194,042 B2

JIG FOR SEMICONDUCTOR PRODUCTION AND METHOD FOR PRODUCING SAME

TECHNICAL FIELD

The present invention relates to a jig used for a CVD device in a semiconductor production process, and a method for producing the same.

BACKGROUND ART

In a production process of an ultra-highly integrated semiconductor device such as DRAM or MPU, forming a thin film of $Si_3N_4$, polysilicon or the like as a gate insulting film or a capacitor on a surface of a semiconductor wafer is one of important processes. Formation of such a coating film on the surface of a semiconductor wafer is generally conducted using a low pressure CVD device. And various kinds of jigs such as a wafer boat using SiC or the like as a jig base are used in such a low pressure CVD device.

For example, as a jig using SiC as a jig base, there may be mainly used a product in which a porous SiC sintered body obtained by adding a binder to an SiC powder as a raw material, followed by molding, calcining and degreasing is impregnated with molten metal silicon (Si) to completely fill its pores with Si, thereby achieving gas-impermeability. Then, a surface of such a jig is coated with a protective film such as an SiC coating film, thereby suppressing diffusion of impurities to the outside from the inside of the jig.

In a semiconductor production process, a semiconductor wafer is placed on such a jig, and a thin film of $Si_3N_4$, polysilicon or the like (hereinafter referred to as a "deposit film") is formed on the wafer surface by a CVD method. In such a case, the deposit film is unavoidably formed on the surface of the jig.

A jig having the surface coated with an SiC coating film or the like has a problem that a deposit film peels from the surface of the jig at a relatively early stage, and particles and the like are generated. Therefore, the jig surface is required to be frequently cleaned with hydrofluoric acid, fluoronitric acid or the like to remove the deposit film adhered to the surface. To enhance production efficiency of a semiconductor and to improve product precision, those deposit films are required to make difficult to peel from the jig surface. Therefore, attempt to enhance the adhesive force of the deposit film by roughening the jig surface is conventionally conducted.

For example, Patent Document 1 mentioned below discloses an SiC jig characterized in that in an Si-impregnated SiC jig on which an SiC coating film is coated by CVD used in a low pressure CVD device in a semiconductor production process, a thickness of the SiC coating film coated is from 20 to 150 μm, and an average surface roughness Ra of the SiC coating film is from 1.5 to 5.0 μm.

Patent Document 2 mentioned below discloses a member for processing a semiconductor characterized in that, in a member for processing a semiconductor which is consisting of a silicon carbide film or in which a silicon carbide film is formed on a surface of a base substance of the member for processing a semiconductor used in a semiconductor production process, a surface roughness of the surface of the silicon carbide film is 150/cm or higher in peak count (Pc) when a dead zone width and measurement length of using a surface roughness measuring device is set 0.3 μm and 4 mm, respectively, and the surface of the silicon carbide film has an amount of fluorine atom of 0.3 atomic percentage or less, an amount of organic nitrogen of 0.7 atomic percentage or less, an amount of a hydrocarbon component of 29 atomic percentage or less, and an amount of organic CO of 4 atomic percentage or less in X-ray photoelectron spectrometry.

PRIOR ART REFERENCES

Patent Document

Patent Document 1: JP-A-2000-327459
Patent Document 2: Japanese Patent No. 3956291

SUMMARY OF THE INVENTION

Problems that the Invention is to Solve

With fineness of patterning of a semiconductor device in recent years, a size of foreign matters (particles) which possible become the cause of product defect tends to become fine. For this reason, generation of particles is required to be suppressed as possible in a production process of a semiconductor device.

However, even though surface roughness is regulated, adhesiveness of the deposit film cannot sufficiently be obtained. Therefore, for example in the case that particle control level is set 0.1 μm or more, it was difficult to suppress the generation of particles.

Accordingly, an object of the present invention is to provide a jig for semiconductor production, which can effectively prevent a deposit film from peeling from a surface of the jig, and a method for producing the same.

Means for Solving the Problems

The present invention provides the following embodiments of the invention.

[1] A jig for semiconductor production which is used for a CVD device in a semiconductor production process and comprises a jig base and an SiC coating film formed (coated) on the jig base,
wherein the SiC coating film has a surface area ratio (surface area S2/surface area S1) between an apparent surface area Si as calculated on the assumption that the surface is flat and free from unevenness and an actual surface area S2, of from 1.4 to 3.2.

[2] The jig for semiconductor production according to [1], wherein
the SiC coating film is covered with pyramidal SiC crystallites on the surface thereof, and
the SiC crystallite has an average value of an aspect ratio (height H/minimum length L of the base) between a height H of the pyramid and the minimum length L of the base of the pyramid of from 0.5 to 1.5.

[3] The jig for semiconductor production according to [1] or [2], wherein
the SiC coating film contains at least α-type crystal structure, and in the peak measured by X-ray diffraction,
a ratio (I-65°)/(I-60°) between a peak intensity (I-60°) in a range of 2θ=59.5° to 60.5° and a peak intensity (I-65°) in a range of 2θ=65° to 66° is 0.1 or more,
and a ratio {(I-35°)/[(I-41°)+(I-65°)]} between a peak intensity (I-35°) in a range of 2θ=35° to 36° and the sum of a peak intensity (I-41°) in a range of 2θ=41° to 42° and the peak intensity (I-65°) of 2θ=65° to 66° is 50 or more.

[4] The jig for semiconductor production according to any one of [1] to [3], wherein the SiC coating film has an average of the minimum length L of the base of the pyramidal SiC crystallite covering the surface of from 0.5 to 10.0 μm.

[5] The jig for semiconductor production according to any one of [1] to [4], wherein the SiC coating film has a thickness of from 20 to 150 μm.

[6] The jig for semiconductor production according to any one of [1] to [5], wherein the SiC coating film has an average surface roughness Ra of from 0.5 to 3.0 μm.

[7] The jig for semiconductor production according to any one of [1] to [6], wherein the SiC coating film has a metal impurity concentration of from 0.005 to 0.5 ppm.

[8] The jig for semiconductor production according to any one of [1] to [7], wherein the SiC coating film has the number of anomalous grains of less than $1/cm^2$.

[9] The jig for semiconductor production according to any one of [1] to [8], wherein the jig base comprises Si-impregnated SiC.

[10] A method for producing the jig for semiconductor production according to any one of [1] to [9], the method comprising introducing raw material compounds that is to form an SiC coating film, into a CVD device having a jig base stored therein, and forming an SiC coating film in a non-oxygen atmosphere having an oxygen gas concentration of 10,000 ppm or less under the conditions of from 1,100° C. to 1,350° C. and from 0.1 kPa to 2.6 kPa.

Here, the temperature of from 1,100° C. to 1,350° C. indicates a temperature in a CVD chamber at which the SiC coating film is formed in the CVD device, and the pressure of from 0.1 kPa to 2.6 kPa indicates a pressure in the chamber at the time of reaction.

Advantages of the Invention

According to the jig for semiconductor production of the present invention, by setting the surface area ratio (surface area S2/surface area S1) of the SiC coating film which coats the surface of the jig base to from 1.4 to 3.2, in forming a deposit film of $Si_3N_4$, polysilicon or the like on a surface of a semiconductor wafer such as a wafer boat placed on the jig in a CVD device, the deposit film unavoidably form on the jig surface strongly adheres to the jig surface. As a result, even though a thickness of the deposition film on the jig surface is increased, the deposit film becomes difficult to peel, and generation of particles and the like can be effectively prevented. Furthermore, frequency of cleaning required for removing the deposit film formed on the jig can be reduced, and this can improve productivity of a semiconductor.

According to the method for producing a jig for semiconductor production of the present invention, by introducing raw material compounds that is to form an SiC coating film, into a CVD device having a jig base stored therein, and forming an SiC coating film in a non-oxidizing atmosphere under the conditions of from 1,100° C. to 1,350° C. and from 0.1 kPa to 2.6 kPa, pyramidal SiC crystallites in which c axes are aligned with respect to a film surface in a given proportion or more are exposed on a surface of the SiC coating film. As a result, a jig for semiconductor production in which the surface is coated with an SiC film of which the surface area ratio is from 1.4 to 3.2, and adhesion between the jig base and the SiC film is good, can be produced.

BRIEF DESCRIPTION OF THE DRAWINGS

FIG. 7 is an explanatory view of a jig (1), the jig base, the interface of the film and the jig base (2). an apparent surface area (S1), and an actual surface area (S2); the SiC coating film is 3.

MODE FOR CARRYING OUT THE INVENTION

Figure 1:
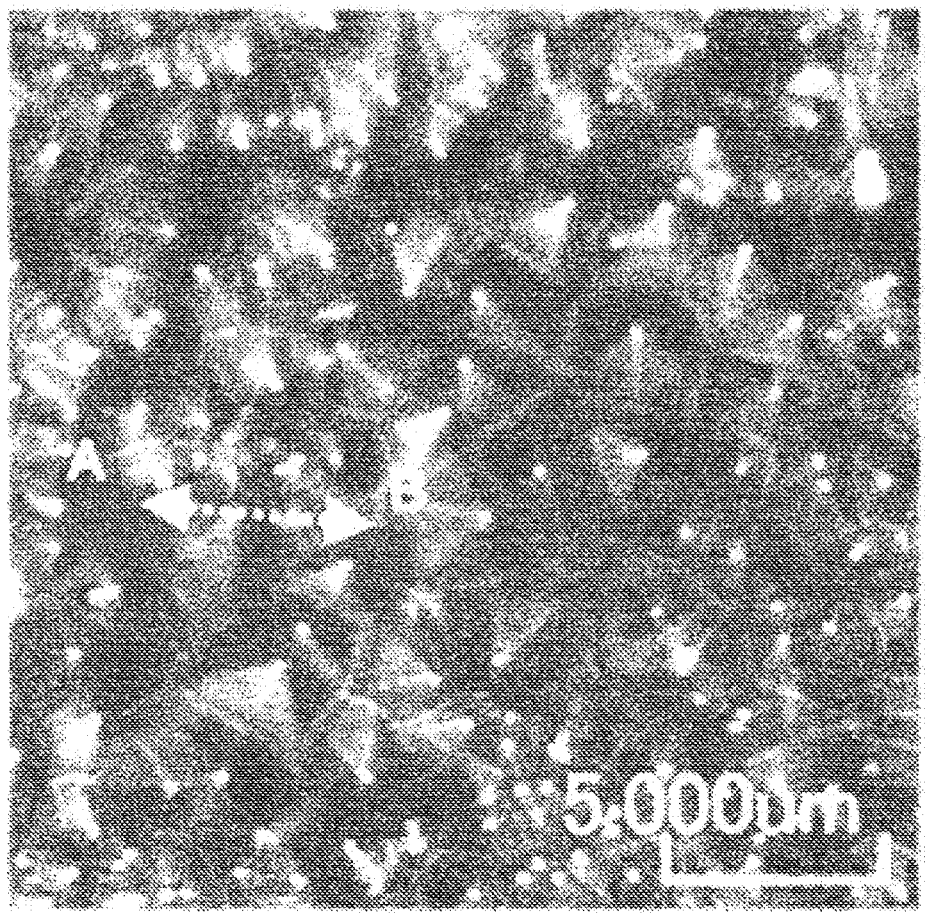
FIG. 1 is an optical micrograph taken from a film surface side of an SiC coating film of the jig of Example 1.

The jig for semiconductor production of the present invention has a surface layer of a jig base coated with, that is, formed by, an SiC coating film.

Material of the jig base includes sintered SiC, SiC impregnated with Si (hereinafter referred to as an "Si-impregnated SiC"), C (carbon), Si (silicon), quartz glass, and alumina. Of those, Si-impregnated SiC is preferred because it is dense and has high purity, and can form a jig having excellent gas permeability and strength.

The jig base containing the sintered SiC can be produced, for example, as follows. That is, a jib base can be obtained by adding binder such as an acrylic resin aqueous emulsion or polyvinyl alcohol to an α-type SiC powder or a β-type SiC powder, subjecting the resulting mixture to cold isotropic press or cast molding to form a molded body, and subjecting the molded body to calcination and degreasing under a non-oxidizing atmosphere.

Further, the jig base containing the Si-impregnated SiC is obtained by, for example, impregnating the SiC sintered body obtained as above with molten metal Si, thereby filling its pores and capillaries with Si.

The jig for semiconductor production of the present invention contains such a jig base having a surface coated with an SiC coating film. The SiC coating film for coating the surface of the jig base is described below.

The SiC coating film of the jig for semiconductor production of the present invention has a surface area ratio (surface area S2/surface area S1) between an apparent surface area Si as calculated on the assumption that the surface is flat and free from unevenness and an actual surface area S2, of from 1.4 to 3.2.

In the present description, unless otherwise specifically indicated, the term "from . . . to . . . " is used to mean that the numerical values described are included as the lower limit and the upper limit.

The present inventors have found that, by exposing pyramidal SiC crystallites in which c axes are aligned with respect to a film surface in a given proportion or more on the surface of the SiC coating film, the surface area of the SiC coating film can be increased compared to the conventional one, and the surface area ratio (surface area S2/surface area S1) can be set to from 1.4 to 3.2. Furthermore, by setting the surface area to the above range, adhesiveness to a deposit film formed on the SiC coating film is improved, and even though the film thickness of the deposit film on the jig surface is increased, the deposit film becomes difficult to peel. As a result, for example, even where particle control level is 0.1 μm or more, generation of particles and the like can be effectively suppressed. Where the surface area ratio (surface area S2/surface area S1) is less than 1.4, adhesiveness to the deposit film formed on the SiC coating film cannot be improved so much, whereas where the surface area ratio exceeds 3.2, strength of the SiC coating film is decreased and handling properties are impaired. The surface area ratio is preferably from 1.7 to 3.0, and more preferably from 2.0 to 2.5.

The surface area ratio can be measured as follows. That is, using a laser microscope having confocal optical system, a sample surface is subjected to laser scanning at 1,500-fold magnification, and analysis is conducted based on the obtained three-dimensional image. The reason that such a high magnification is selected is for the purpose of avoiding the influence of waviness in microscale (cycle of waviness is several ten μm or more) of a jig base and an SiC film as possible. It is preferred to select a site free of projections other than unevenness of crystal particles themselves as a view field. Furthermore, because spike-like noise by laser light scattered by edge of crystal is included in height data obtained, where the surface area S2 is directly calculated, the error becomes large. To decrease the error, smoothening by simple average of general 3 pixels×3 pixels is applied three times to remove the noise, and thereafter, calculation of the surface area S2 is carried out. As the pyramid shape, six-sided pyramid shape is particularly preferred.

A value obtained by dividing the surface area S2 thus calculated, by an image area, that is, an apparent surface area S1 is taken as a surface area ratio.

The SiC coating film may be covered with pyramidal SiC crystallites on its surface, and has an average value of an aspect ratio (height H/minimum length L of the base) between height H of the pyramid of the SiC crystallite and the minimum length L of the base of the pyramid of preferably from 0.5 to 1.5, and more preferably from 0.7 to 1.3. Where the average value of the aspect ratio is less than 0.5, the surface area ratio tends to be decreased, whereas where the average value exceeds 1.5, strength of the SiC coating film may be decreased and handling properties are liable to be impaired.

The aspect ratio of the SiC crystallite can be controlled by, for example, changing a crystal structure of the SiC coating film and orientation of the SiC crystallite. To change the crystal structure of the SiC coating film and the orientation of the SiC crystallite, those can be adjusted by controlling film formation conditions in forming the SiC coating film, specifically, film formation temperature, film formation pressure, gas flow rate, and gas concentration. To increase the aspect ratio, it can be achieved by increasing the ratio of α-type crystal or enhancing orientation of SiC crystallite. For example, to increase the ratio of α-type crystal or enhance orientation of SiC crystallite, it can be achieved by suppressing nuclear formation of crystal, thereby retarding the growth. This can be achieved by maintaining a film formation temperature in a constant range, and decreasing film formation pressure or decreasing gas concentration.

The aspect ratio (height H/minimum length L of the base) of the SiC crystallite and the minimum length L of the base can be measured using, for example, three-dimensional shape data of a film surface obtained using a confocal laser microscope. This is described below using a specific example.

Figure 2:
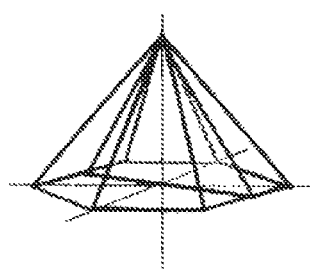
FIG. 2 is an explanatory view in the case that a traverse line A-B is set and a cross-section of a six-sided pyramidal crystal is taken.

FIG. 1 shows an optical micrograph taken from a film surface side of the SiC coating film of the jig for semiconductor production of the present invention (the jig of Example 1 described below). As is apparent from FIG. 1, the surface of the SiC coating film is covered with many six-sided pyramidal crystals (that is, α-type crystals). Next, a traverse line A-B is set so as to pass through the apex of a pyramidal crystal to be measured, in a (cross-sectional) profile measurement mode of a laser microscope. In this case, as shown in FIG. 2, the direction of the traverse line A-B is adjusted so as to divide equally the respective two facing pyramidal surfaces. FIG. 2 shows an example in the case that a cross-section of a six-sided pyramidal crystal is taken, but in the case of other polygonal crystals, a traverse line A-B is similarly set, and a cross-section is taken.

Figure 3:
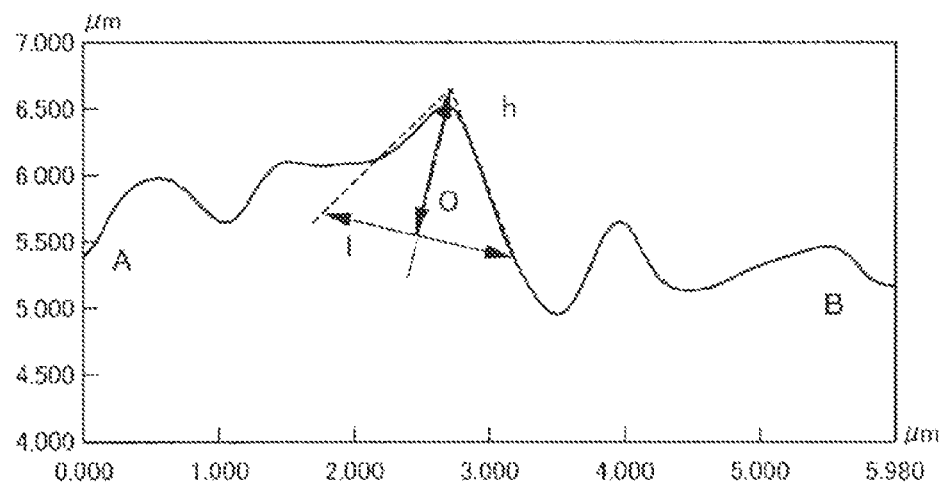
FIG. 3 is a profile of a film cross-section along the traverse line A-B of FIG. 1.

FIG. 3 shows a profile of a film cross-section taken along the traverse line A-B in FIG. 1. The cross-section of the crystal to be noted is appeared in from 2 μm to 3.5 μm of a horizontal coordinate. Here, auxiliary lines (dot line) are drawn so as to be along pyramidal surfaces until the point that the profiles separate 5%, and a standard line (one-dot chain line) is drawn so as to divide equally an apex angle that can be formed at the intersecting point of two auxiliary lines. A line vertical to the standard line is drawn so as to pass through the lower edge of the longer line of the two auxiliary lines, and the intersecting point is designated as "O". In the vertical line, a length (I) of from one pyramidal surface (lower edge of the auxiliary line) to the other pyramidal surface (intersecting point to an extended line of the other auxiliary line) is measured. The minimum value of (I) in the crystal to be noted is designated as the minimum length L of the base of a pyramid. Further, length (h) of from the position (O) to the intersecting point of the auxiliary lines is measured, and the (h) is designated as a height H of the pyramid. Then, the value obtained by dividing the height H of the pyramid obtained as above by the minimum length L of the base of the pyramid is designated as the aspect ratio. The minimum length L and the aspect ratio of 50 pyramidal crystals optionally selected are measured as above, and the average values thereof are used as an average value of the minimum length L. and an average value of the aspect ratio, respectively.

The similar measurement is alternatively possible by preparing a sample having an observable film cross-section by mechanical polishing and observing the same with an optical microscope, a scanning electron microscope (SEM) or the like. However, there are many cases that the cross-section does not always pass through the apex of or cases that the cross-section does not divide equally the respective two facing pyramidal surfaces. Therefore, measurement error is easy to cause.

It is preferred that the SiC coating film contains at least α-type crystal structure, and in the peak measured by X-ray diffraction, a ratio (I-65°)/(I-60°) between a peak intensity (hereinafter referred to as peak intensity (I-60°) in a range of 2θ=59.5° to 60.5° and a peak intensity (hereinafter referred to as peak intensity (I-65°)) in a range of 2θ=65° to 66° is 0.1 or more, and a ratio {(I-35°)/[(I-41°)+(I-65°)]} between a peak intensity (hereinafter referred to as peak intensity (I-35°) in a range of 2θ=35° to 36° and the sum of a peak intensity (hereinafter referred to as peak intensity (I-41))° in a range of 2θ=41° to 42° and the peak intensity (I-65°) is 50 or more.

X-ray diffraction pattern variously varies depending on configuration pattern of atoms constituting a crystal, a size of crystal particles, orientation of crystal particles, and the like, but an angle (diffraction angle) at which X-ray diffraction peak is observed is principally determined by atomic configuration (kind and size of crystal lattices). Therefore, in crystals having similar atomic configuration, there are many cases that intensity peak appears at the same diffraction angle.

For example, as shown in Table 1, by the crystal structure of non-orientation SiC film obtained by the conventional film formation conditions, several kinds of crystals of α-type (hexagonal crystal and rhombohedral crystal: 4H, 6H, 51R and the like) and β-type (cubic crystal: 3C) appear. Those crystals have similar basic atomic configurations but merely differ in the order of lamination of atomic layers. Therefore, strong peak of diffraction line appears at the similar angle.

TABLE 1

| | Diffraction angle (2θ) | 33.5 | 34.2 | 34.8 | 35.6 | 41.5 | 60 | 65.7 | 71.8 |
|---|---|---|---|---|---|---|---|---|---|
| Relative strength | Rhombohedral crystal (51R) | — | 50 | — | 100 | 20 | 50 | 20 | 50 |
| | Hexagonal crystal (4H) | 25 | — | 100 | 65 | — | 47 | 32 | 30 |
| | Hexagonal crystal (6H) | — | 40 | — | 100 | 10 | 35 | 15 | 40 |
| | Cubic crystal (3C) | — | — | — | 100 | 20 | 35 | — | 25 |

Noting the peak (peak intensity (I-65°)) of 2θ=65.7° in Table 1, since β-type diffraction line is not present at this angle, in the case that the reflection is observed in the measurement pattern of the sample, α-type crystal is always present.

In view of the above, in the present invention, a value (hereinafter referred to as ratio ((I-65°/(I-60°)) obtained by dividing the peak intensity (I-65°) by the peak intensity (I-60°) is used as an index that the α-type crystal is present.

As is apparent from Table 1, the ratio (I-65°)/(I-60°) has a value between 0.4 and 0.7 depending on the kind of α-type, and in the case of β-type, the ratio becomes 0. Actually, in the case of preparing the SiC coating film by a CVD method, several kinds of crystal phases are mixed in many cases. If hexagonal crystal (α-type crystal) is substantially present in an amount of 30% or more, the surface area S2 can be increased, and the surface area ratio is easy to be adjusted to from 1.4 to 3.2. Therefore, the ratio (I-65°)/(I-60°) is preferably 0.1 or more, and more preferably 0.5 or more.

Orientation of the SiC crystallite is described below. In the case of measuring X-ray diffraction peak with general 2θ/θ scanning, the case that reflection surface of the crystal is parallel to the film surface gives peak intensity. For example, the peak (peak intensity (I-35°)) of 2θ=35.6° is reflection by a plane ((00L) plane) vertical to hexagonal (or trigonal) axis in the case of α-type, and reflection by a plane ((111) plane) vertical to trigonal axis in the case of a cubic crystal. When azimuths of crystals in the film are aligned and those reflection surfaces become parallel to the film surface, diffraction to this angle becomes strong compared to diffraction line of other angle.

On the other hand, the peak intensity (I-41°) becomes strong in proportion to the number of crystals that (111) plane is not oriented in parallel to the film surface in β-type crystal, and the peak intensity (I-65°) becomes strong in proportion to the number of crystals that (00L) plane is not oriented in parallel to the film surface in the α-type crystal. The sum of those peak intensities is thus in proportion to the sum of the crystals that are not oriented, regardless of α-type or β-type.

In view of the above, in the present invention, a value (hereinafter referred to as ratio {(I-35°)/[(I-41°)+(I-65°)]}) obtained by dividing the peak intensity (I-35°) by the sum of the peak intensity (I-41°) and the peak intensity (I-65°) is used as an index of orientation of SiC crystallites.

From Table 1, in the case of the non-orientation film, the ratio {(I-35°)/[(I-41°)+(I-65°)]} varies from 1.5 up to 5.0 depending on the kind of crystal phase. The present invention defines that the preferred ratio of the orientation is 50 or more. This means that 90% or more is oriented to (111) plane, for example, in the case of crystal phase that a cubic crystal is a main component. This also means that orientation is further high in the case that α-type coexists. That is, the fact that the ratio {(I-35°)/[(I-41°)+(I-65°)]} is 50 or more becomes an index showing that 90% or more of the SiC crystallites is SiC crystallites having c axis vertical to the film surface. By enhancing orientation of crystals, since pyramidal surfaces such as (112) plane and (114) plane of α-type and (111) plane of a cubic crystal become easy to develop, the surface area ratio of the SiC coating film can be easy to increase. The ratio {(I-35°)/[(I-41°)+(I-65°)]} is preferably 50 or more, and more preferably 200 or more.

In the present invention, an average of the minimum length L of the base of the SiC crystallite is preferably from 0.5 to 10.0 and more preferably from 2.0 to 6.0 μm. In the case that the average of the minimum length L is smaller than the range, adhesiveness to the deposit film formed on the SiC coating film is not sufficiently obtained, whereas in the case that the average of the minimum length L is larger than the range, adhesiveness between the SiC base and the SiC coating film is not sufficiently obtained.

In the present invention, a thickness of the SiC coating film is preferably from 20 to 150 μm, and more preferably from 50 to 100 μm. Where the thickness is less than 20 μm, impurities may diffuse to the film surface from the inside of the jig. Furthermore, increasing the thickness of the SiC coating film more than the necessity is useless, and additionally requires long time to form the coating film. Therefore, the upper limit of the thickness is sufficient to be 150 μm.

In the present invention, an average surface roughness Ra of the SiC coating film is preferably from 0.5 to 3.0 μm, and more preferably from 0.8 to 2.0 μm. Where the average surface roughness Ra is less than 0.5 μm, adhesion force of CVD thin film can not sufficiently be obtained in some cases, whereas where the Ra exceeds 3.0 μm, many initial dusts due to CVD thin film peeled from the jig may be generated. The average surface roughness Ra in the present invention is a value measured in accordance with JIS B-0601-2001 using an electron-type surface roughness tester.

In the present invention, a metal impurity concentration of the SiC coating film is preferably from 0.005 to 0.5 ppm, and more preferably from 0.005 to 0.1 ppm. The metal impurities are Fe, Cu, Mg, Al, V, Ni, Mn, Na, K, Ca, Cr and the like mainly originated from diffusion from the inside of the jig base, sandblast treatment of jig surface, and the like, and they are harmful elements having a possibility of, when incorporated in a wafer, inducing decrease in insulating resistance, decrease in withstand voltage of $SiO_2$, pn bonding leakage defect, and the like to a semiconductor device. When the metal impurity concentration is 0.5 ppm or less, a wafer placed on a jig can be prevented from being contaminated with metal impurities in the film. The metal impurity concentration of 0.5 ppm or less can be achieved by, for example, using raw material compounds and a carrier gas, having low metal impurity concentration (metal impurities are preferably less than 10 ppm), previously subjecting the inside of a furnace to vacuum heating at a temperature of a film formation temperature or higher, or using graphite, which is a constituent member of the inside of the furnace, having low metal impurity concentration (preferably less than 0.2 ppm), in the SiC coating film formation process. The metal impurity concentration in the SiC coating film can be measured with a method such as atomic absorption analysis, SIMS (secondary ion mass spectrometry), total reflection fluorescent X-ray analysis, or GDMS (glow discharge mass spectrometry). In the present description, in the case that metal impurities contained in the SiC coating film are plural kinds, the metal impurity concentration means a concentration of the sum of those metal impurities.

Figure 6:
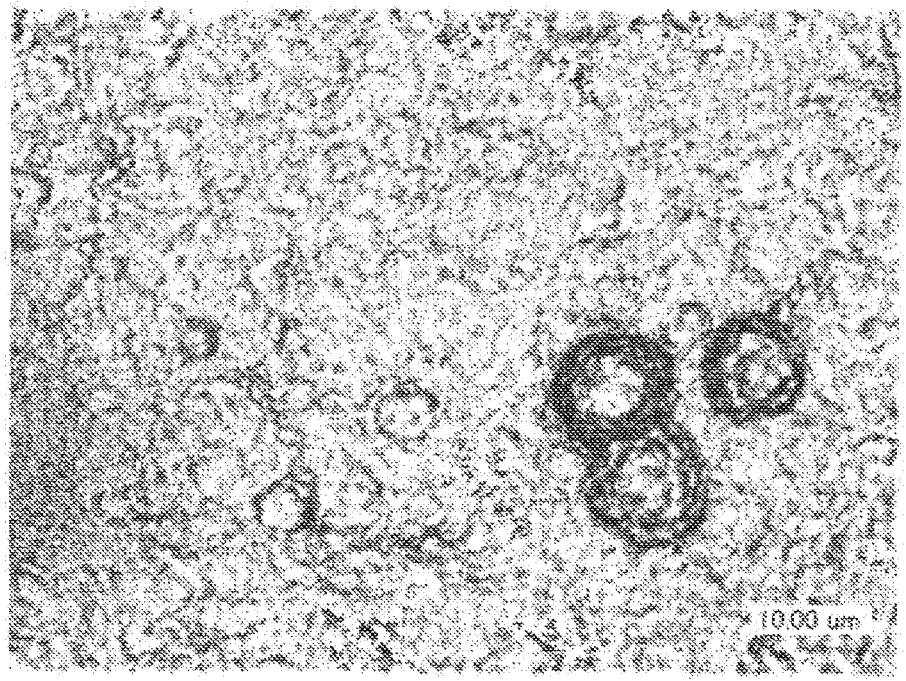
FIG. 6 is an optical micrograph of anomalous grain taken from a film surface side of an SiC coating film of the jig of Comparative Example 2.

In the present invention, the number of anomalous grains in the SiC coating film is preferably less than $1/cm^2$, and more preferably less than $0.5/cm^2$. The anomalous grain is a particle as shown in FIG. 6, and is a particle which is locally 10 μm or more higher than the other surface. It is known that the anomalous grain is originated from the presence of a powder in gas phase or on a surface of a jig base, and impurities. When the number of the anomalous grains is less than $1/cm^2$, occurrence of cracks due to stress concentration in the inside of a deposit film can be suppressed. The number of anomalous grains of less than $1/cm^2$ can be achieved by, for example, eliminating stagnation part of gas flow in a furnace, maintaining the inside of the furnace and a jig base surface clean, or controlling to conditions that do not generate nuclei (for example, not rising temperature too much), in the SiC coating film formation process. The anomalous grains in the SiC coating film can be measured, for example, by subjecting a sample surface to laser scanning using a laser microscope.

The method for producing a jig for semiconductor production of the present invention is described below.

An SiC coating film is formed on the surface of the jig base described above by a CVD method. CVD device used is not particularly limited. A heat diffusion furnace type equipped with gas inlet and outlet, in which heating is conducted with a heating means such as electric furnace of a vertical batch or a horizontal batch, is preferred. The jig base is stored in the CVD device, raw material compounds to be form the SiC coating film are introduced therein, and the SiC coating film is formed by the gas phase decomposition reaction. To avoid the formation of $SiO_2$, the reaction is conducted in a non-oxygen atmosphere having an oxygen gas concentration of 10,000 ppm or less.

Any compound containing Si source and C source can be used as raw material compounds to be form the SiC coating film.

For example, the following (1) and (2) are exemplified.

(1) Compounds having Si source and C source, such as trichloromethylsilane ($CH_3SiCl_3$) and dichlorodimethylsilane (($CH_3)_2SiCl_2$).

(2) Mixture of compounds having Si source, such as silane ($SiH_4$), disilane ($Si_2H_6$), tetrachlorosilane ($SiCl_4$) and trisilane ($Si_3H_8$), and compounds having C source, such as methane ($CH_4$) and ethane ($C_2H_6$).

Those may be introduced without dilution, and may be introduced by diluting with a carrier gas (hydrogen, or an inert gas such as helium or argon). In the case of diluting with the carrier gas, the concentration of the raw material compound in terms of a molar ratio to the carrier gas is preferably from 1 to 10 mol %, and more preferably from 2 to 6 mol %. By adjusting a molar ratio of the raw material compound to the carrier gas to the above range, a desired film can be obtained, and industrially practical growth rate can be achieved.

Feed rate of a raw material compound-containing gas fed from the gas inlet of the CVD device is preferably from 10 to 50 liters/min, and more preferably from 20 to 40 liters/min. By adjusting the feed rate of the feeding gas to the above range, industrially practical growth rate of a film can be achieved.

Reaction conditions in film-forming the SiC coating film by the gas phase reaction decomposition reaction is that the reaction temperature is set from 1,100° C. to 1,350° C., and the reaction pressure is set from 0.1 kPa to 2.6 kPa. The reaction temperature is preferably from 1,150 to 1,330° C., and more preferably from 1,200 to 1,300° C. The reaction temperature means the atmosphere temperature in the reaction chamber of the CVD device. The reaction pressure is preferably from 0.5 to 2.0 kPa, and more preferably from 1.0 to 1.5 kPa. The reaction pressure means the pressure in the reaction chamber of the CVD device. Where the reaction temperature is lower than 1,100° C., growth rate becomes low, and costs are increased, whereas where the reaction temperature exceeds 1,350° C., anomalous grains are easily generated, and a film having a necessary surface area ratio may not be obtained. In the case of using Si-impregnated SiC in the jig base, the reaction temperature to the jig base surface is preferably from 1,100 to 1,250° C. Where the temperature exceeds 1,250° C., a porous layer is generated between the Si-impregnated SiC of the jig base, and adhesiveness between the SiC film and the jig base is impaired. In this case, there are a method in which plural coating is conducted, and the first coating temperature is adjusted to this temperature range, a method in which the coating initiation temperature is adjusted to this temperature and the temperature is elevated in the course of the coating, and the like. Where the reaction pressure is less than 0.1 kPa, a high ability pump is required and high facility costs are required, whereas where the reaction pressure exceeds 2.6 kPa, a film having a necessary surface area ratio may not be obtained.

EXAMPLES

The present invention is described in detail below by reference to Examples and Comparative Examples, but the invention is not construed as being limited to those Examples.

[Measurement Method]

Measurement of Surface Area Ratio

Using a laser microscope, sample surfaces of Examples 1 to 5 and Comparative Examples 1 to 5 were subjected to laser scanning at 1,500-fold magnification. A three-dimensional image obtained was subjected to smoothening by simple average of 3 pixels×3 pixels three times to remove the noise, and calculation of the surface area S2 was carried out. The surface area S2 obtained was divided by an image area, and the surface area ratio was calculated.

Measurement of Average Value of Aspect Ratio

A traverse line was set so as to pass through the apex of a pyramidal crystal to be measured and to divide equally the respective two facing pyramidal surfaces in a (cross-sectional) profile measurement mode of a laser microscope, and thereby a cross-sectional profile was measured. In the cross-section of a crystal to be noted in the cross-sectional profile, auxiliary lines were drawn along the pyramidal surfaces, and a standard line was drawn so as to divide equally the apex angle formed at an intersecting point of two auxiliary lines. A line vertical to the standard line was drawn at an appropriate position (O) on the standard line, and a length (l) of from one pyramidal surface (auxiliary line) to the other pyramidal surface was measured to obtain the minimum length L of the base of the pyramid. Furthermore, a length (h) of from the position (O) to the intersecting point of the auxiliary lines was measured to obtain a height H of the pyramid. A value obtained by dividing the height H of the pyramid obtained above by the minimum length L of the base of the pyramid was calculated as an aspect ratio.

Thus, aspect ratios of 50 pyramidal crystals optionally selected were measured, and the average thereof was used as the average value of the aspect ratio.

X-Ray Diffraction

GEIGERFLEX RAD-IIA manufactured by Rigaku Denki was used as an X-ray diffraction device, and measurement was conducted under the following conditions. CuKα ray was used as an X-ray source, accelerating voltage of X-ray tube was set 40 kV, and accelerating current was set 20 mA. Divergent slit (DS) was set 1°, light-receiving slit (RS) was set 0.15 mm, and scattering slit (RS) was set 1°. Measurement was conducted in a range of 2θ=10° to 75°. Peak intensity was obtained by performing smoothing treatment (after removing noise of background part by an adaptive smoothening method, smoothening is conducted by Savitzky-Golay method), and then removing background by Sonnevel method.

Measurement of Average Surface Roughness Ra

Using an electron type surface roughness tester, each 4 points were measured in accordance with JIS B-0601.

Measurement of Metal Impurity Concentration

Analysis of metal impurities in an SiC coating film was conducted by GDMS (glow discharge mass spectrometry) method, and its total amount was obtained.

Measurement of the Number of Anomalous Grains

Using an optical microscope and a laser microscope, 5000 images of a sample surface were observed at 100-fold magnification, and the number of anomalous grains having a height exceeding 10 μm was counted.

Observation of Presence or Absence of Porous Layer of Jig Base

A cross-section of a sample was observed using an optical microscope at 500-fold magnification.

Formation Test of $Si_3N_4$ Thin Film

A 12 inch silicon wafer was mounted on a jig having an SiC coating film formed thereon, and this was set to a low pressure CVD device. $Si_3N_4$ was used as a film-forming raw material, and $SiH_2Cl_2$ and $NH_3$ were fed in $SiH_2Cl_2/NH_3$=15/60 (molar ratio). $Si_3N_4$ thin film was formed at 25 Pa at atmosphere temperature of 750° C. of a reaction chamber.

The silicon wafer was taken out of the CVD device every formation of 100 nm $Si_3N_4$ thin film on the silicon wafer, the silicon wafer surface was irradiated with laser beam, and the number of particles on the entire upper surface of the silicon wafer was counted. The film formation was stopped at the time that the number of particles having a diameter of 0.1 μm or more reaches 50, and film thickness of the $Si_3N_4$ thin film (deposit film) formed on the jig surface at that time was measured.

Example 1

A molding was formed by filter press using an α-type SiC powder as a raw material and polyvinyl alcohol as a binder, and the molding was baked to obtain an SiC sintered body. The SiC sintered body was impregnated with molten Si to obtain Si-impregnated SiC. Supporting groove part was formed on the Si-impregnated SiC by mechanical processing to thereby prepare an SiC boat base which is a jig base for a 12-inch wafer.

Next, the boat base was placed in a low pressure thermal CVD furnace. After deaerating the gas contained in the base under vacuum of 10 Pa, the inside of the furnace was heated at a temperature rising rate of 15° C./min to increase the temperature to 1,000° C. Then, Hydrogen gas was introduced in the furnace, the pressure was maintained at 13.2 kPa for 60 minutes, and cleaning treatment of dusts and the like was conducted.

Subsequently, the low pressure thermal CVD furnace was heated at a temperature rising rate of 15° C./min to increase the temperature in the furnace to 1,230° C. Then, the reaction pressure was adjusted to 0.5 kPa, $CH_3SiCl_3$ was introduced as a raw material gas for forming an SiC coating film, and hydrogen gas was introduced as a carrier gas. $CH_3SiCl_3$ was fed in a molar ratio to the hydrogen gas as a carrier gas of 10%. Film formation was conducted for 180 minutes under the above conditions, and a jig of Example 1 was produced.

The SiC coating film formed on the jig base surface of the jig had a surface area ratio of 2.4, a film thickness of 50 μm, an average surface roughness Ra of 2.4 μm, a concentration of metal impurities of 0.025 ppm, and the number of anomalous grains of 0/cm².

As a result of observing the SiC coating film with a scanning electron microscope, the surface was covered with pyramidal SiC crystallites. The average value of the aspect ratio was 1.1, and the average value of the minimum length L of the base was 3.5 μm. Optical micrograph taken from the film surface side of the SiC coating film of the jig of Example 1 is shown in FIG. 1, and a profile of the film cross-section along the traverse line A-B in FIG. 1 is shown in FIG. 3.

As a result of X-ray diffraction of the SiC coating film, α-type and β-type were present in a mixed state as crystal structures. In the peak measured by the X-ray diffraction, the ratio ((I-65°)/(I-60°) was 0.71 and the ratio {(I-35°)/[(I-41°)+(I-65°)]} was 350.

As a result of observation of the cross-section, a porous layer was not observed at the interface (jig base side) between the SiC coating film and the jig base.

The jig was that $Si_3N_4$ thin film (deposit film) can be deposited up to 6.5 μm.

Example 2

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,230° C. Thereafter, the reaction pressure was adjusted to 1 kPa, and the raw material gas and the carrier gas were fed under the same conditions as in Example 1 to conduct film formation for 90 minutes. After once cooling, the cleaning treatment was again conducted under the same conditions as in Example 1. Subsequently, the low pressure thermal CVD furnace was heated in a temperature rising rate of 15° C./min to increase the temperature to 1,350° C., and the reaction pressure was adjusted to 0.5 kPa. After that, the raw material gas and the carrier gas were fed under the same conditions as in Example 1 to conduct film formation for 90 minutes, and a jig of Example 2 was produced.

The SiC coating film formed on the jig base surface of the jig had a surface area ratio of 3.1, a film thickness of 50 μm, an average surface roughness Ra of 2.9 μm, a concentration of metal impurities of 0.008 ppm, and the number of anomalous grains of 0/cm².

As a result of observing the SiC coating film with a scanning electron microscope, the surface was covered with pyramidal SiC crystallites. The average value of the aspect ratio of the pyramid was 1.5, and the average value of the minimum length L of the base was 4.2 μm.

As a result of X-ray diffraction of the SiC coating film, α-type and β-type were present in a mixed state as crystal structures. In the peak measured by the X-ray diffraction, the ratio ((I-65°)/(I-60°) was 1.22, and the ratio {(I-35°)/[(I-41°)+(I-65°)]} was 720.

As a result of observation of the cross-section, a porous layer was not observed at the interface (jig base side) between the SiC coating film and the jig base.

The jig was that $Si_3N_4$ thin film (deposit film) can be deposited up to 6.8 μm.

Example 3

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,230° C., and the reaction pressure was adjusted to 2.5 kPa. Thereafter, the raw material gas and the carrier gas were fed under the same conditions as in Example 1 to conduct film formation for 180 minutes, and a jig of Example 3 was produced.

The SiC coating film formed on the jig base surface of the jig had a surface area ratio of 1.7, a film thickness of 50 μm, an average surface roughness Ra of 1.3 μm, a concentration of metal impurities of 0.032 ppm, and the number of anomalous grains of $0/cm^2$.

As a result of observing the SiC coating film with a scanning electron microscope, the surface was covered with pyramidal SiC crystallites. The average value of the aspect ratio of the pyramid was 0.7, and the average value of the minimum length L of the base was 1.0 μm.

As a result of X-ray diffraction of the SiC coating film, α-type and β-type were present in a mixed state as crystal structures. In the peak measured by the X-ray diffraction, the ratio ((I-65°)/(I-60°) was 0.37 and the ratio {(I-35°)/[(I-41°)+(I-65°)]} was 120.

As a result of observation of the cross-section, a porous layer was not observed at the interface (jig base side) between the SiC coating film and the jig base.

The jig was that $Si_3N_4$ thin film (deposit film) can be deposited up to 4.3 μm.

Example 4

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,230° C., and the reaction pressure was decreased to 1 kPa. $SiCl_4$ and $CH_4$ were introduced as raw material gases for forming an SiC coating film, and hydrogen gas was introduced as a carrier gas. $SiCl_4$ and $CH_4$ were fed in a molar ratio to the hydrogen gas as a carrier gas of 10% and 3%, respectively. Film formation was conducted for 200 minutes under the above conditions, and a jig of Example 4 was produced.

The SiC coating film formed on the jig base surface of the jig had a surface area ratio of 1.6, a film thickness of 50 μm, an average surface roughness Ra of 1.8 μm, a concentration of metal impurities of 0.015 ppm, and the number of anomalous grains of $0/cm^2$.

As a result of observing the SiC coating film with a scanning electron microscope, the surface was covered with pyramidal SiC crystallites. The average value of the aspect ratio of the pyramid was 0.7, and the average value of the minimum length L of the base was 1.1 μm.

As a result of X-ray diffraction of the SiC coating film, α-type and β-type were present in a mixed state as crystal structures. In the peak measured by the X-ray diffraction, the ratio ((I-65°)/(I-60°) was 0.64 and the ratio {(I-35°)/[(I-41°)+(I-65°)]} was 280.

As a result of observation of the cross-section, a porous layer was not observed at the interface (jig base side) between the SiC coating film and the jig base.

The jig was that $Si_3N_4$ thin film (deposit film) can be deposited up to 4.5 μm.

Example 5

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,230° C. The reaction pressure was adjusted to 1 kPa, and the raw material gas and the carrier gas were fed under the same conditions as in Example 4 to conduct film formation for 90 minutes. After once cooling, the cleaning treatment was again conducted under the same conditions as in Example 1. Thereafter, the temperature was increased at a temperature rising rate of 15° C./min to 1,350° C., and the reaction pressure was adjusted to 1 kPa. The raw material gas and the carrier gas were fed under the same conditions as in Example 4 to conduct film formation for 90 minutes, and a jig of Example 5 was produced.

The SiC coating film formed on the jig base surface of the jig had a surface area ratio of 2.1, a film thickness of 50 μm, an average surface roughness Ra of 2.9 μm, a concentration of metal impurities of 0.014 ppm, and the number of anomalous grains of $0/cm^2$.

As a result of observing the SiC coating film with a scanning electron microscope, the surface was covered with pyramidal SiC crystallites. The average value of the aspect ratio of the pyramid was 1.0, and the average value of the minimum length L of the base was 7.5 μm.

As a result of X-ray diffraction of the SiC coating film, α-type and β-type were present in a mixed state as crystal structures. In the peak measured by the X-ray diffraction, the ratio ((I-65°)/(I-60°)) was 1.08, and the ratio {(I-35°)/[(I-41°)+(I-65°)]} was 650.

As a result of observation of the cross-section, a porous layer was not observed at the interface (jig base side) between the SiC coating film and the jig base.

The jig was that $Si_3N_4$ thin film (deposit film) can be deposited up to 5.2 μm.

Comparative Example 1

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,230° C., and the reaction pressure was adjusted to 10 kPa. Thereafter, the raw material gas and the carrier gas were fed under the same conditions as in Example 1 to conduct film formation for 180 minutes, and a jig of Comparative Example 1 was produced.

The SiC coating film formed on the jig base surface of the jig had a surface area ratio of 1.3, a film thickness of 60 μm, an average surface roughness Ra of 1.0 μm, a concentration of metal impurities of 0.025 ppm, and the number of anomalous grains of $0/cm^2$.

Figure 4:
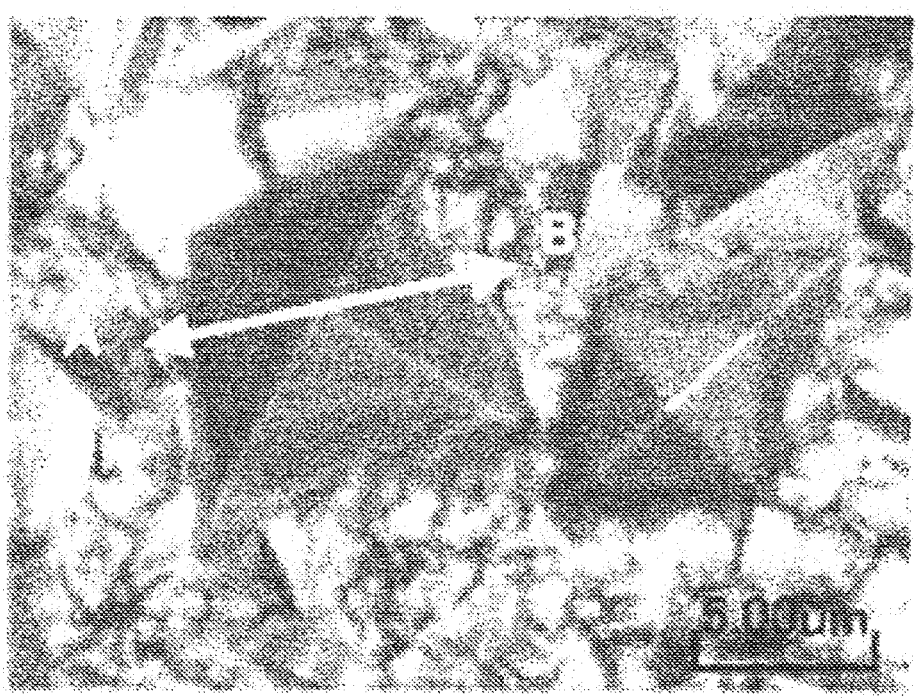
FIG. 4 is an optical micrograph taken from a film surface side of an SiC coating film of the jig of Comparative Example 1.
Figure 5:
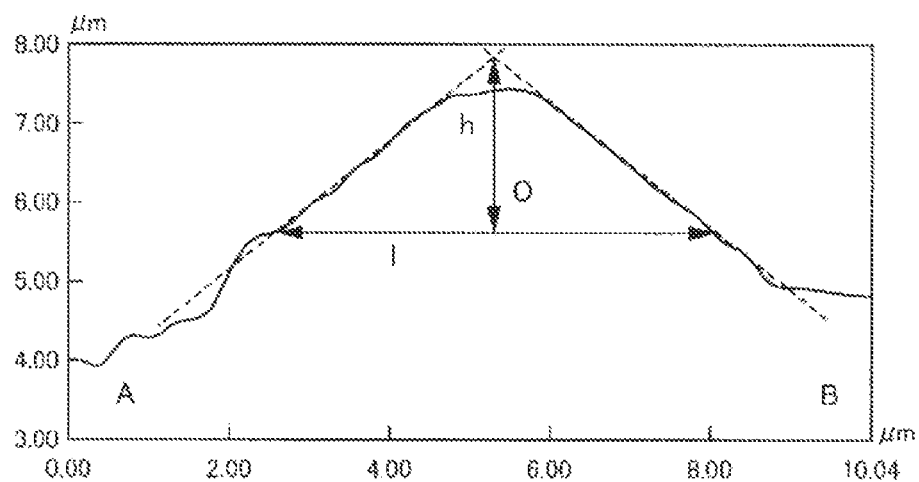
FIG. 5 is a profile of a film cross-section along a traverse line A-B of FIG. 4.

As a result of observing the SiC coating film with a scanning electron microscope, the surface was covered with pyramidal SiC crystallites. The average value of the aspect ratio of the pyramid was 0.2, and the average value of the minimum length L of the base was 0.3 μm. Optical micrograph taken from the film surface side of the SiC coating film of the jig of Comparative Example 1 is shown in FIG. 4, and a profile of the film cross-section along the traverse line A-B in FIG. 4 is shown in FIG. 5.

As a result of X-ray diffraction of the SiC coating film, only β-type was present as a crystal structure. In the peak measured by the X-ray diffraction, the ratio ((I-65°)/(I-60°)) was 0, and the ratio {(I-35°)/[(I-41°)+(I-65°)]} was 5.

As a result of observation of the cross-section, a porous layer was not observed at the interface (jig base side) between the SiC coating film and the jig base.

The jig was that $Si_3N_4$ thin film (deposit film) can be deposited up to 2.5 μm.

Comparative Example 2

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,380° C., and the reaction pressure was adjusted to 1 kPa. Thereafter, the raw material gas and the carrier gas were fed under the same conditions as in Example 1 to conduct film formation for 90 minutes, and a jig of Comparative Example 2 was produced.

The SiC coating film formed on the jig base surface of the jig had a surface area ratio of 1.3, a film thickness of 60 μm, an average surface roughness Ra of 3.2 μm, a concentration of metal impurities of 0.025 ppm, and the number of anomalous grains of 26/cm².

As a result of observing the SiC coating film with a scanning electron microscope, the surface was covered with pyramidal SiC crystallites. The average value of the aspect ratio of the pyramid was 0.8, and the average value of the minimum length L of the base was 3.1 μm.

As a result of X-ray diffraction of the SiC coating film, α-type and β-type were present in a mixed state as crystal structures. In the peak measured by the X-ray diffraction, the ratio ((I-65°)/(I-60°) was 0.03, and the ratio {(I-35°)/[(I-41°)+(I-65°)]} was 30.

As a result of observation of the cross-section, a porous layer was observed at the interface (jig base side) between the SiC coating film and the jig base.

The jig was that $Si_3N_4$ thin film (deposit film) can be deposited up to 2.9 μm.

Comparative Example 3

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,200° C., and the reaction pressure was adjusted to 4 kPa. $SiCl_4$ and $CH_4$ were introduced as raw material gases for forming an SiC coating film, and hydrogen gas was introduced as a carrier gas. $SiCl_4$ and $CH_4$ were fed in a molar ratio to the hydrogen gas as a carrier gas of 5% and 1.6%, respectively. Film formation was conducted for 180 minutes under the above conditions. Thereafter, the SiC coating film formed on the jig surface was acid-cleaned with fluoronitric acid (HF=4.0 mol %, $HNO_3$=3.7 mol %), and then subjected to showering with hot water for 60 minutes. Thus, a jig of Comparative Example 3 was produced.

The SiC coating film formed on the jig base surface of the jig had a surface area ratio of 1.2, a film thickness of 55 μm, an average surface roughness Ra of 1.0 μm, a concentration of metal impurities of 0.010 ppm, and the number of anomalous grains of 0/cm².

As a result of observing the SiC coating film with a scanning electron microscope, the surface was covered with pyramidal SiC crystallites. The average value of the aspect ratio of this pyramid was 0.3, and the average value of the minimum length L of the base was 0.4 μm.

As a result of X-ray diffraction of the SiC coating film, α-type and β-type were present in a mixed state as crystal structures. In the peak measured by the X-ray diffraction, the ratio ((I-65°)/(I-60°) was 0.02 and the ratio {(I-35°)/[(I-41°)+(I-65°)]} was 4.

As a result of observation of the cross-section, a porous layer was not observed at the interface (jig base side) between the SiC coating film and the jig base.

The jig was that $Si_3N_4$ thin film (deposit film) can be deposited up to 2.8 μm.

Comparative Example 4

An SiC boat base produced in the same manner as in Example 1 was placed in a low pressure thermal CVD furnace, and cleaning treatment was conducted under the same conditions as in Example 1. Then, the inside of the furnace was heated at a temperature rising rate of 15° C./min to increase the temperature to 1,230° C., and the reaction pressure was adjusted to 30 kPa. Thereafter, $SiCl_4$ and $CH_4$ were introduced as raw material gases for forming an SiC coating film, and hydrogen gas was introduced as a carrier gas. $SiCl_4$ and $CH_4$ were fed in a molar ratio to the hydrogen gas as a carrier gas of 5% and 1.6%, respectively.

Film formation was conducted for 180 minutes under the above conditions, and a jig of Comparative Example 4 was produced.

The SiC coating film formed on the jig base surface of the jig had a surface area ratio of 1.3, a film thickness of 58 μm, an average surface roughness Ra of 2.0 μm, a concentration of metal impurities of 0.018 ppm, and the number of anomalous grains of 0/cm².

As a result of observing the SiC coating film with a scanning electron microscope, the surface was covered with pyramidal SiC crystallites. The average value of the aspect ratio of this pyramid was 0.2, and the average value of the minimum length L of the base was 0.3 μm.

As a result of X-ray diffraction of the SiC coating film, α-type and β-type were present in a mixed state as crystal structures. In the peak measured by the X-ray diffraction, the ratio ((I-65°)/(I-60°) was 0.04, and the ratio {(I-35°)/[(I-41°)+(I-65°)]} was 8.

As a result of observation of the cross-section, a porous layer was not observed on the jig base surface.

The jig was that $Si_3N_4$ thin film (deposit film) can be deposited up to 2.9 μm.

Comparative Example 5

The SiC coating film on the surface of the jig prepared in Comparative Example 1 was subjected to sandblast treatment with #250 SiC abrasive particles.

The SiC coating film formed on the jig base surface of the jig had a surface area ratio of 1.2, a film thickness of 55 μm, an average surface roughness Ra of 3.5 μm, a concentration of metal impurities of 0.025 ppm, and the number of anomalous grains of 0/cm².

As a result of observing the SiC coating film with a scanning electron microscope, pyramidal crystallites were not observed.

As a result of X-ray diffraction of the SiC coating film, only β-type was present as a crystal structure. In the peak measured by the X-ray diffraction, the ratio ((I-65°/(I-60° was 0, and the ratio))){(I-35°/[(I-41°)+(I-65°)]} was 5.

As a result of observation of the cross-section, a porous layer was not observed at the interface (jig base side) between the SiC coating film and the jig base.

The jig was that $Si_3N_4$ thin film (deposit film) can be deposited up to 2.7 μm.

The results of the above are shown in Tables 2 and 3.

ness is increased, generation of particles and the like can be effectively prevented, and furthermore, frequency of cleaning required to remove the deposit film formed on the jig can be reduced. As a result, productivity can be improved in semiconductor production, which is useful.

Furthermore, according to the method for producing a jig for semiconductor production of the present invention, there can be produced a good jig for semiconductor production in which adhesiveness between the jig base and the SiC coating film is enhanced, generation of particles and the like can be effectively prevented, and frequency of cleaning required to remove the deposit film formed on the jig can be reduced. Thus, the method is useful.

TABLE 2

|  | Film thickness (μm) | Surface area ratio | Average surface roughness Ra (μm) | Aspect ratio | Minimum length L of base of crystallite (μm) | Concentration of metal impurities (ppm) |
| --- | --- | --- | --- | --- | --- | --- |
| Example 1 | 50 | 2.4 | 2.4 | 1.1 | 3.5 | 0.025 |
| Example 2 | 50 | 3.1 | 2.9 | 1.5 | 4.2 | 0.008 |
| Example 3 | 50 | 1.7 | 1.3 | 0.7 | 1 | 0.032 |
| Example 4 | 50 | 1.6 | 1.8 | 0.7 | 1.1 | 0.015 |
| Example 5 | 50 | 2.1 | 2.9 | 1 | 7.5 | 0.014 |
| Comparative Example 1 | 60 | 1.3 | 1 | 0.2 | 0.3 | 0.025 |
| Comparative Example 2 | 60 | 1.3 | 3.2 | 0.8 | 3.1 | 0.025 |
| Comparative Example 3 | 55 | 1.2 | 1 | 0.3 | 0.4 | 0.01 |
| Comparative Example 4 | 58 | 1.3 | 2 | 0.2 | 0.3 | 0.018 |
| Comparative Example 5 | 55 | 1.2 | 3.5 | — | — | 0.025 |

TABLE 3

|  | Number of anomalous grains (/cm²) | X-ray diffraction Ratio (I-65°/I-60°) | X-ray diffraction Ratio {I-35°/(I-41° + I-65°)} | Porous layer on base surface | Possible thickness of $Si_3N_4$ thin film deposited (μm) |
| --- | --- | --- | --- | --- | --- |
| Example 1 | 0 | 0.71 | 350 | None | 6.5 |
| Example 2 | 0 | 1.22 | 720 | None | 6.8 |
| Example 3 | 0 | 0.37 | 120 | None | 4.3 |
| Example 4 | 0 | 0.64 | 280 | None | 4.5 |
| Example 5 | 0 | 1.08 | 650 | None | 5.2 |
| Comparative Example 1 | 0 | 0 | 5 | None | 2.5 |
| Comparative Example 2 | 26 | 0.03 | 30 | Observed | 2.9 |
| Comparative Example 3 | 0 | 0.02 | 4 | None | 2.8 |
| Comparative Example 4 | 0 | 0.04 | 8 | None | 2.9 |
| Comparative Example 5 | 0 | 0 | 5 | None | 2.7 |

Although the present invention has been described in detail and by reference to the specific embodiments, it is apparent to one skilled in the art that various modifications or changes can be made without departing the spirit and scope of the present invention.

This application is based on Japanese Patent Application No. 2009-237502 filed on Oct. 14, 2009, and the disclosure of which is incorporated herein by reference.

INDUSTRIAL APPLICABILITY

In forming a deposit film of $Si_3N_4$, polysilicon or the like on a semiconductor wafer surface, the deposit film is unavoidably formed on a jig surface. However, when the jig for semiconductor production of the present invention is used in a CVD device used in a semiconductor production process, the deposit film is difficult to peel even when the film thick-

The invention claimed is:

1. A jig for semiconductor production which is used for a CVD device in a semiconductor production process and comprises a jig base and an SiC coating film formed on the jig base, wherein the SiC coating film has a surface area ratio (surface area S2/surface area S1) between an apparent surface area S1 at the interface of the jig base and the SiC film as calculated on the assumption that the surface is flat and free from unevenness and an actual surface area S2, of from 1.4 to 3.2, and wherein the SiC coating film is covered with pyramidal SiC crystallites on the surface thereof, and the SiC crystallite has an average value of an aspect ratio (height H/minimum length L of the base) between a height H of the pyramid and the minimum length L of the base of the pyramid, of from 0.5 to 1.5.

2. The jig for semiconductor production according to claim 1, wherein the SiC coating film contains at least α-type crystal structure, and in the peak measured by X-ray diffraction, a ratio))(I-65°/(I-60° between a peak intensity)(I-60° in a range of 2θ=59.5° to 60.5° and a peak intensity)(I-65° in a range of 2θ=65° to 66° is 0.1 or more, and a ratio {(I-35°/[(I-41°+(I-65°]} between a peak intensity)(I-35° in a range of 2θ=35° to 36° and the sum of a peak intensity)(I-41°) in a range of 2θ-41° to 42° and the peak intensity)(I-65° of 2θ=65° to 66° is 50 or more.

3. The jig for semiconductor production according to claim 1, wherein the SiC coating film has an average of the minimum length L of the base of the pyramidal SiC crystallite covering the surface of from 0.5 to 10.0 μm.

4. The jig for semiconductor production according to claim 1, wherein the SiC coating film has a thickness of from 20 to 150 μm.

5. The jig for semiconductor production according to claim 1, wherein the SiC coating film has an average surface roughness Ra of from 0.5 to 3.0 μm.

6. The jig for semiconductor production according to claim 1, wherein the SiC coating film has a metal impurity concentration of from 0.005 to 0.5 ppm.

7. The jig for semiconductor production according to claim 1, wherein the SiC coating film has the number of anomalous grains of less than $1/cm^2$.

8. The jig for semiconductor production according to claim 1, wherein the jig base comprises Si-impregnated SiC.

9. A method for producing the jig for semiconductor production according to claim 1, the method comprising introducing raw material compounds that is to form an SiC coating film, into a CVD device having a jig base stored therein, and forming an SiC coating film in a non-oxygen atmosphere having an oxygen gas concentration of 10,000 ppm or less under the conditions of from 1,100° C. to 1.350° C. and from 0.1 kPa to 2.6 kPa.

\* \* \* \* \*